(12) United States Patent
Terai et al.

(10) Patent No.: US 8,748,882 B2
(45) Date of Patent: Jun. 10, 2014

(54) THIN FILM TRANSISTOR, ELECTRONIC DEVICE, DISPLAY DEVICE, AND METHOD OF MANUFACTURING THIN FILM TRANSISTOR

(75) Inventors: Yasuhiro Terai, Kanagawa (JP); Eri Fukumoto, Kanagawa (JP); Toshiaki Arai, Kanagawa (JP); Narihiro Morosawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 353 days.

(21) Appl. No.: 13/014,363

(22) Filed: Jan. 26, 2011

(65) Prior Publication Data

US 2011/0186853 A1 Aug. 4, 2011

(30) Foreign Application Priority Data

Feb. 3, 2010 (JP) ................ P2010-022160

(51) Int. Cl.
*H01L 29/18* (2006.01)
*H01L 29/12* (2006.01)

(52) U.S. Cl.
CPC ..................................... *H01L 29/12* (2013.01)
USPC .............................................. 257/43; 257/72

(58) Field of Classification Search
USPC ................. 257/72, 43, 59, E29.117, E29.273
See application file for complete search history.

(56) References Cited

U.S. PATENT DOCUMENTS 7,564,055 B2 * 7/2009 Hoffman ......................... 257/43

FOREIGN PATENT DOCUMENTS

| JP | 2007-519256 | 7/2007 |
| JP | 2008-85048 | 4/2008 |
| WO | 2005-074038 A1 | 8/2005 |

OTHER PUBLICATIONS

Cetin Kilic et al., "n-type doping of oxides by hydrogen", Applied Physics Letters, Jul. 1, 2002, vol. 81-1, pp. 73-75.

* cited by examiner

*Primary Examiner* — Marc Armand
(74) *Attorney, Agent, or Firm* — K&L Gates LLP

(57) ABSTRACT

A thin film transistor is provided. The thin film transistor includes a gate electrode, a gate insulating film, and an oxide semiconductor film, wherein at least a portion of the gate electrode includes a metal oxide. An electric device and a display device that include the thin film transistor are also provided in addition to a manufacture method.

31 Claims, 19 Drawing Sheets

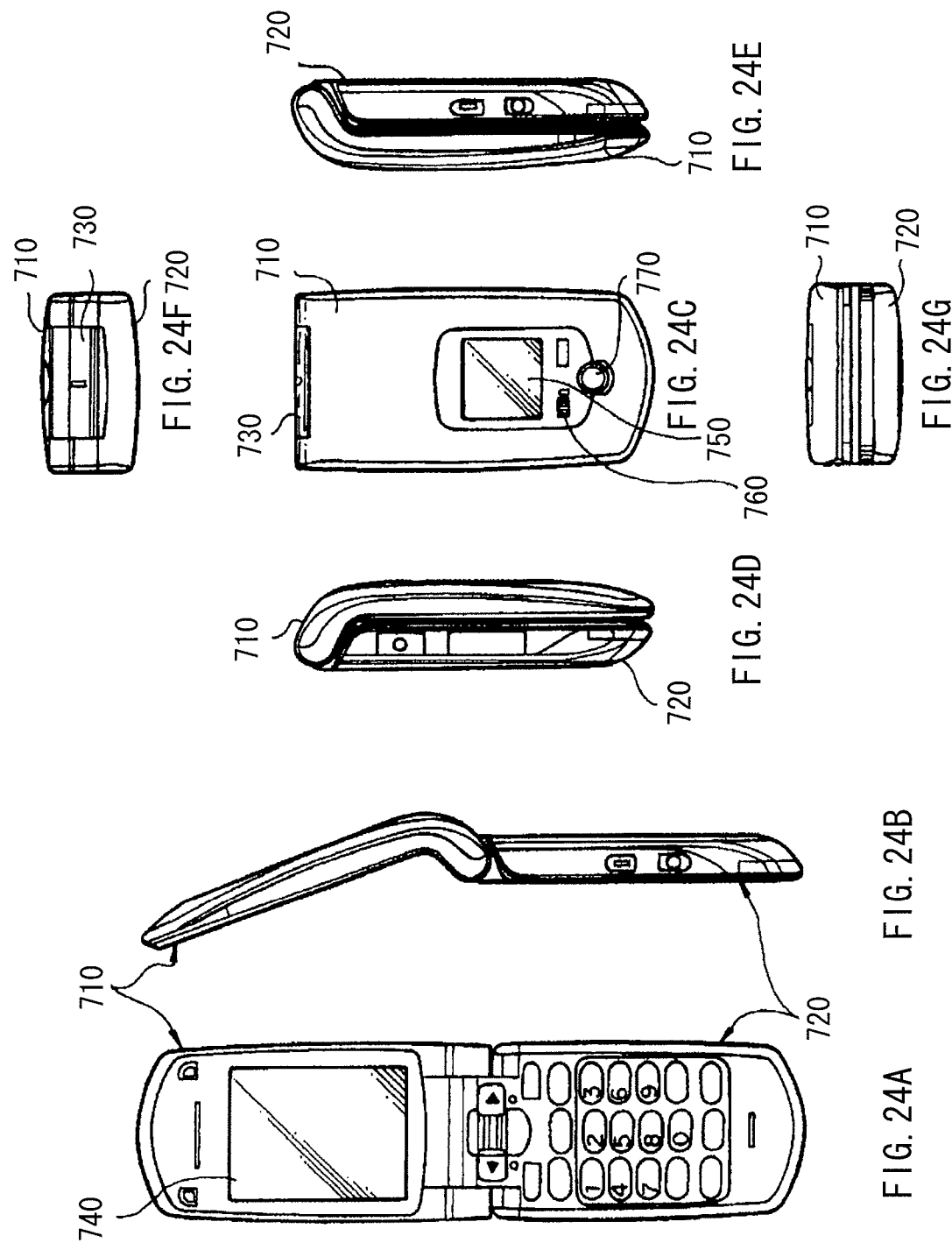

THIN FILM TRANSISTOR, ELECTRONIC DEVICE, DISPLAY DEVICE, AND METHOD OF MANUFACTURING THIN FILM TRANSISTOR

CROSS REFERENCES TO RELATED APPLICATIONS

The present application claims priority to Japanese Priority Patent Application JP 2010-022160 filed in the Japanese Patent Office on Feb. 3, 2010, the entire contents of which is hereby incorporated by reference.

BACKGROUND

The present application relates to a thin film transistor (TFT) using oxide semiconductor, a method of manufacturing the same, and a display unit including such a thin film transistor.

Oxide semiconductor composed of zinc oxide, indium gallium zinc oxide (IGZO) or the like shows superior characteristics as an active layer of a semiconductor device. In recent years, development has been promoted in an effort to apply the oxide semiconductor to a TFT, a light emitting device, a transparent conducting film or the like.

For example, in the TFT using the oxide semiconductor, electron mobility is high and its electric characteristics are superior compared to the existing TFT using amorphous silicon (a-Si: H) as a channel that is used for a liquid crystal display. Further, the TFT using the oxide semiconductor has an advantage that high mobility is expected even if the channel is formed at a low temperature around room temperature.

Meanwhile, it has been known that in the oxide semiconductor, the heat resistance is not sufficient, and thus due to heat treatment in a manufacturing process of the TFT, oxygen, zinc and the like are detached and lattice defect is formed. The lattice defect results in forming an electrically shallow impurity level, and causes low resistance of the oxide semiconductor layer. Thus, in the TFT using the oxide semiconductor as an active layer, it results in normally-on type operation or depression type operation in which a drain current is flown without applying a gate voltage, the threshold voltage is decreased as the defect level is increased, and the leakage current is increased.

Meanwhile, in addition to the foregoing lattice defect, hydrogen has been reported as an element to form shallow impurity level (for example, see "n-type doping of oxides by hydrogen," Cetin Kilic et al., Applied Physics Letters, Jul. 1, 2002, Vol. 81, No. 1, pp. 73 to 75). Thus, in addition to the lattice defect, an element such as hydrogen introduced in manufacturing process of the TFT has been regarded as a substance that affects characteristics of the TFT using the oxide semiconductor. Accordingly, in the transistor having the oxide semiconductor as a channel, carrier concentration in the channel tends to be increased, and the threshold voltage tends to be negative.

Further, in the TFT using the oxide semiconductor as a channel, it is difficult to form P-channel. Thus, the circuit should be formed from only an N-channel transistor. At this time, there is a disadvantage that if the threshold voltage becomes negative, the circuit configuration becomes complicated. To solve such a disadvantage, the threshold voltage should be controlled. The threshold voltage is expressed by the following mathematical formula.

$$V_{Th} = \phi_{MS} - \frac{Q_f}{C_{OX}} + 2\phi_f + \frac{\sqrt{2\varepsilon_s\varepsilon_0 qN_A 2\phi_f}}{C_{OX}} \quad \text{Mathematical formula}$$

In the formula, Vth represents the threshold voltage, ΦMS represents work function difference between a gate electrode and an oxide semiconductor film, Qf represents fixed charge, COX represents gate insulating film capacity, Φf represents Fermi level of the oxide semiconductor film as a channel, NA represents acceptor density, ∈S represents relative permittivity of the oxide semiconductor film, and ∈0 represents dielectric constant in vacuum, respectively.

As a method of changing the threshold voltage, trials to change the threshold voltage have been made by doping impurity in part of a channel in an interface of a thin film transistor and a gate insulating film, or by changing ratio of elements of oxide semiconductor (for example, see Japanese Unexamined Patent Application Publication Nos. 2007-519256 and 2008-85048).

SUMMARY

However, there is concern that doping the channel may cause characteristics deterioration of the thin film transistor. Further, in general, the active layer of the oxide semiconductor is made of a multi-element system material, and sputtering method is used as a method of forming a film. Thus, in the case where doping the channel is made by sputtering method, since the active layer of the oxide semiconductor is made of the multi-element system material, controlling element ratio of the active layer has been significantly difficult.

In view of the foregoing, it is desirable to provide a thin film transistor capable of increasing the threshold voltage without adding impurity to a channel, a method of manufacturing the same, and a display unit including the thin film transistor.

In the thin film transistor of an embodiment, at least part in the thickness direction from the interface with the gate insulating film of the gate electrode is composed of the metal oxide. Thus, work function in the interface with the gate insulating film of the gate electrode is increased. Thus, in the following mathematical formula, work function difference ΦMS between the gate electrode and the oxide semiconductor film is increased, and threshold voltage Vth is increased.

$$V_{Th} = \phi_{MS} - \frac{Q_f}{C_{OX}} + 2\phi_f + \frac{\sqrt{2\varepsilon_s\varepsilon_0 qN_A 2\phi_f}}{C_{OX}} \quad \text{Mathematical formula}$$

In the formula, Vth represents the threshold voltage, ΦMS represents the work function difference between a gate electrode and an oxide semiconductor film, Qf represents fixed charge, COX represents gate insulating film capacity, Φf represents Fermi level of the oxide semiconductor film as a channel, NA represents acceptor density, ∈S represents relative permittivity of the oxide semiconductor film, and ∈0 represents dielectric constant in vacuum, respectively.

In an embodiment, a thin film transistor is provided. The thin film transistor including a gate electrode, a gate insulating film, and an oxide semiconductor film, wherein at least a portion of the gate electrode includes a metal oxide.

In an embodiment, the gate electrode includes an interface layer in contact with the gate insulating film, and wherein the interface layer includes the metal oxide.

In an embodiment, the gate electrode further includes a metal layer in contact with the interface layer.

In an embodiment, the metal layer includes a metal substance or alloy thereof selected from the group consisting of platinum, titanium, ruthenium, molybdenum, copper, tungsten, and nickel.

In an embodiment, the gate electrode is the metal oxide.

In an embodiment, the metal oxide contains at least one metal component selected from the group consisting of platinum, titanium, ruthenium, molybdenum, copper, tungsten, and nickel.

In an embodiment, the gate insulating film includes a low reducing material.

In an embodiment, the low reducing material is selected from the group consisting of a silicon oxide film, a silicon nitride film, an aluminum oxide film, an aluminum nitride film, and combinations thereof.

In an embodiment, the thin film transistor is configured as a top gate structure or a bottom gate structure.

In another embodiment, an electric device is provided. The electric device including a thin film transistor including a gate electrode, a gate insulating film, and an oxide semiconductor film, wherein at least a portion of the gate electrode includes a metal oxide.

In a further embodiment, a display device is provided. The display device including a thin film transistor including a gate electrode, a gate insulating film, and an oxide semiconductor film, wherein at least a portion of the gate electrode includes a metal oxide.

In an embodiment, a method of forming a thin film transistor is provided. The method includes forming a gate electrode, a gate insulating film, and an oxide semiconductor film, wherein at least a portion of the gate electrode includes a metal oxide.

In an embodiment, the metal oxide is formed by forming a metal layer and applying a gas plasma to the metal layer.

In an embodiment, the gas plasma contains nitric monoxide or oxygen.

In an embodiment, the metal oxide is formed by forming a metal layer and applying a heat treatment to the metal layer.

In an embodiment, the heat treatment is annealing in an atmosphere containing oxygen or moisture.

In an embodiment, the metal oxide is formed by applying an oxidation gas to the metal layer during formation of the gate electrode.

In an embodiment, the gate electrode includes an interface layer in contact with the gate insulating film, and wherein the interface layer includes the metal oxide.

In an embodiment, the gate electrode further includes a metal layer in contact with the interface layer.

In an embodiment, the metal layer includes a metal substance or alloy thereof selected from the group consisting of platinum, titanium, ruthenium, molybdenum, copper, tungsten, and nickel.

In an embodiment, the gate electrode is the metal oxide.

In an embodiment, the metal oxide contains at least one metal component selected from the group consisting of platinum, titanium, ruthenium, molybdenum, copper, tungsten, and nickel.

In an embodiment, the gate insulating film includes a low reducing material.

In an embodiment, the low reducing material is selected from the group consisting of a silicon oxide film, a silicon nitride film, an aluminum oxide film, an aluminum nitride film, and combinations thereof.

In an embodiment, the thin film transistor is configured as a top gate structure or a bottom gate structure.

In an embodiment, the method further includes producing an electric device.

In an embodiment, the method further includes producing a display device.

According to the thin film transistor of an embodiment or the display unit of an embodiment, the at least part in the thickness direction from the interface with the gate insulating film of the gate electrode is formed from the metal oxide. Thus, the threshold voltage is able to be increased without adding impurity to a channel.

According to a method of manufacturing a thin film transistor of an embodiment, after the gate electrode is formed on the substrate, the at least part in the thickness direction from the surface of the gate electrode is oxidized by using heat treatment or plasma treatment and thereby the at least part in the thickness direction from the surface of the gate electrode is formed from the metal oxide. Thus, adding impurity to the channel is not necessitated, and the thin film transistor of an embodiment is able to be manufactured by the simple steps.

According to a method of manufacturing a thin film transistor of an embodiment, the gate electrode is formed on the substrate, and the at least part in the thickness direction from the surface of the gate electrode is formed by adding oxidation gas and thereby the at least part in the thickness direction from the surface of the gate electrode is formed from the metal oxide. Thus, adding impurity to the channel is not necessitated, and the thin film transistor of an embodiment is able to be manufactured by the simple steps.

According to a method of manufacturing a thin film transistor of an embodiment, after the source electrode and the drain electrode, the oxide semiconductor film, and the gate insulating film are sequentially formed on the substrate, the gate electrode is formed on the gate insulating film. In addition, at least part in the thickness direction from the interface with the gate insulating film of the gate electrode is formed by adding oxidation gas and thereby the at least part in the thickness direction from the interface with the gate insulating film of the gate electrode is formed from the metal oxide. Thus, adding impurity to the channel is not necessitated, and the thin film transistor of an embodiment is able to be manufactured by the simple steps.

Additional features and advantages are described herein, and will be apparent from the following Detailed Description and the figures.

BRIEF DESCRIPTION OF THE FIGURES

FIG. 24A is an elevation view of a sixth application example unclosed, FIG. 24B is a side view thereof, FIG. 24C is an elevation view of the sixth application example closed, FIG. 24D is a left side view thereof, FIG. 24E is a right side view thereof, FIG. 24F is a top view thereof, and FIG. 24G is a bottom view thereof.

DETAILED DESCRIPTION

The present application will be described in detail below with reference to the drawings according to an embodiment. The description will be given in the following order:

1. First embodiment (bottom gate type thin film transistor: example that part in the thickness direction of a gate electrode is oxidized by plasma treatment, and thereby the part in the thickness direction of the gate electrode is composed of a metal oxide)
2. Second embodiment (bottom gate type thin film transistor: example that part in the thickness direction of a gate electrode is formed by adding oxidation gas, and thereby the part in the thickness direction of the gate electrode is composed of a metal oxide)
3. Third embodiment (bottom gate type thin film transistor: example that all in the thickness direction of a gate electrode is composed of a metal oxide)
4. Fourth embodiment (top gate type thin film transistor: example that part in the thickness direction of a gate electrode is composed of a metal oxide)
5. Fifth embodiment (top gate type thin film transistor: example that all in the thickness direction of a gate electrode is composed of a metal oxide)
6. Application examples

First Embodiment

Figure 1:
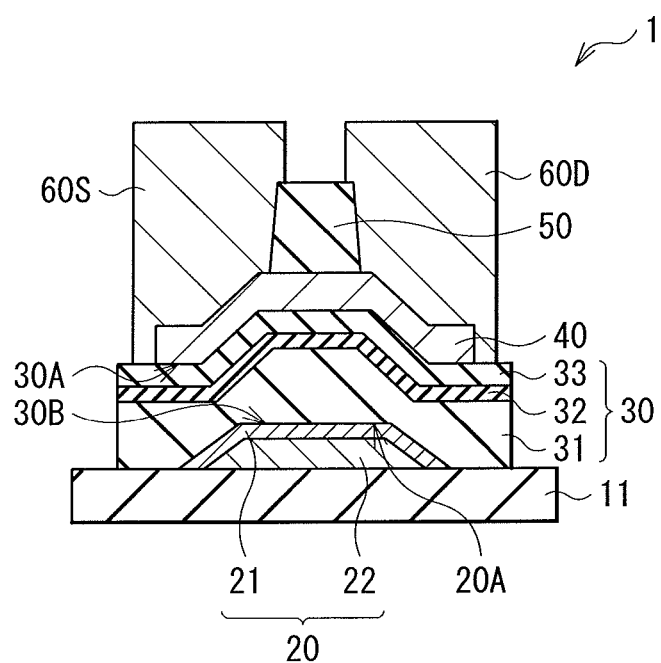
FIG. 1 is a cross sectional view illustrating a structure of a thin film transistor according to a first embodiment.

FIG. 1 illustrates a cross sectional structure of a thin film transistor 1 according to a first embodiment of the invention. The thin film transistor 1 is used as a drive element for a liquid crystal display, an organic EL (Electro Luminescence) display or the like, and has, for example, a bottom gate type structure (inversely staggered structure) in which a gate electrode 20, a gate insulating film 30, an oxide semiconductor film 40, a channel protective film 50, a source electrode 60S, and a drain electrode 60D are layered in this order on a substrate 11.

The substrate 11 is made of a glass substrate, a plastic film or the like. Examples of plastic materials include PET (polyethylene terephthalate) and PEN (polyethylene naphthalate). Since the oxide semiconductor film 40 is formed without heating the substrate 11 in sputtering method described later, an inexpensive plastic film is able to be used.

The gate electrode 20 plays a role to apply a gate voltage to the thin film transistor 1, and control electron density in the oxide semiconductor film 40 by the gate voltage. The gate electrode 20 is provided in a selective region on the substrate 11. The thickness of the gate electrode 20 is, for example, from 10 nm to 500 nm both inclusive. The gate electrode 20 is made of a metal simple substance or an alloy containing at least one selected from the group consisting of platinum (Pt), titanium (Ti), ruthenium (Ru), molybdenum (Mo), copper (Cu), tungsten (W), and nickel (Ni).

The gate electrode 20 has an interface layer 21 composed of a metal oxide in part in the thickness direction from an interface 20A with the gate insulating film 30. Thereby, in the thin film transistor 1, the threshold voltage is allowed to be increased without adding impurity to a channel.

Specifically, the interface layer 21 of the gate electrode 20 is composed of a metal oxide containing at least one selected from the group consisting of platinum (Pt), titanium (Ti), ruthenium (Ru), molybdenum (Mo), copper (Cu), tungsten (W), and nickel (Ni). The remaining section in the thickness direction of the gate electrode 20 is a metal layer 22 composed of the foregoing metal simple substance or the foregoing alloy.

The gate insulating film 30 has two opposed faces 30A and 30B. One face 30A is contacted with the oxide semiconductor film 40, and the other face 30B is contacted with the gate electrode 20. The thickness of the gate insulating film 30 is, for example, from 50 nm to 1 μm both inclusive. The gate insulating film 30 is made of a single layer film or a laminated film composed of a silicon oxide film, a silicon nitride film, a silicon nitride oxide film, an aluminum oxide film or the like.

The gate insulating film 30 preferably includes a film that is contacted with the interface 30B with the gate electrode 20 and is made of a low reducing material such as a silicon oxide film. Thereby, it becomes possible to inhibit the interface layer 21 of the gate electrode 20 from being reduced and to inhibit lowering of work function.

As such a film made of a low reducing material, for example, at least one of a silicon oxide film formed by chemical vapor phase deposition method, a silicon oxide film formed by sputtering method, a silicon nitride film formed by sputtering method, an aluminum oxide film formed by sputtering method, and an aluminum nitride film formed by sputtering method is preferable.

Specifically, the gate insulating film 30 has a structure in which, for example, a silicon oxide film 31 as the film made of a low reducing material, a silicon nitride film 32, and a silicon oxide film 33 are layered in this order from the gate electrode 20 side.

The oxide semiconductor film 40 has a channel region between the source electrode 60S and the drain electrode 60D. The oxide semiconductor film 40 is composed of, for example, a transparent oxide semiconductor having zinc oxide as a main component such as IGZO (indium gallium zinc oxide), zinc oxide, AZO (aluminum-doped zinc oxide), and GZO (gallium-doped zinc oxide). In this case, the oxide semiconductor is a compound containing an element such as indium, gallium, zinc, and tin and oxygen. Considering oxygen supply efficiency by annealing in a manufacturing process, the thickness of the oxide semiconductor film 40 is desirably, for example, from 5 nm to 100 nm both inclusive.

The channel protective film 50 is provided on the channel region of the oxide semiconductor thin film 40. The channel protective film 50 has, for example, a thickness from 50 nm to 500 nm both inclusive, and is made of a silicon oxide film, a silicon nitride film, or an aluminum oxide film.

The source electrode 60S and the drain electrode 60D are provided on the oxide semiconductor film 40 located on both sides of the channel protective film 50, and are electrically connected to the oxide semiconductor film 40. The source electrode 60S and the drain electrode 60D are made of, for example, a metal film such as molybdenum, aluminum, copper, and titanium; a metal film containing oxygen such as ITO (Indium Tin Oxide) and titanium oxide; or a laminated film thereof. Specifically, the source electrode 60S and the drain electrode 60D have a structure, for example, in which a molybdenum layer having a thickness of 50 nm, an aluminum layer having a thickness of 500 nm, and a molybdenum layer having a thickness of 50 nm are layered sequentially.

The source electrode 60S and the drain electrode 60D are preferably made of a metal film containing oxygen such as ITO and titanium oxide. In the case where the oxide semiconductor film 40 is contacted with a metal that easily extracts oxygen, oxygen is detached and lattice defect is formed. If the source electrode 60S and the drain electrode 60D are made of the metal film containing oxygen, it becomes possible to inhibit oxygen from being detached from the oxide semiconductor film 40 and to stabilize electric characteristics of the thin film transistor 1.

The thin film transistor 1 is able to be manufactured, for example, as follows.

Figure 2A:
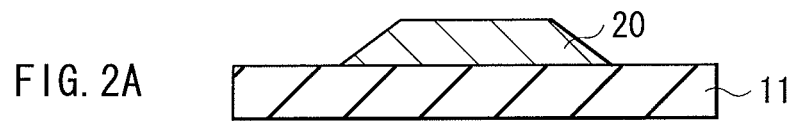
FIGS. 2A to 2C are cross sectional views illustrating a method of manufacturing the thin film transistor illustrated in FIG. 1 in order of steps.

FIG. 2A to FIG. 3C illustrate a method of manufacturing the thin film transistor 1 in order of steps. First, a metal film to become a material of the gate electrode 20 is formed on the whole area of the substrate 11 by using, for example, sputtering method or evaporation method. Next, as illustrated in FIG. 2A, the metal film formed on the substrate 11 is patterned by using, for example, photolithography method to form the gate electrode 20.

Figure 2B:
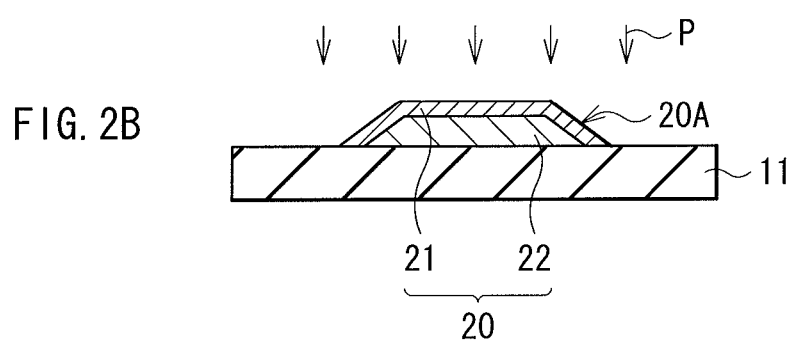

Subsequently, as illustrated in FIG. 2B, the interface layer 21 composed of a metal oxide is formed by exposing part in the thickness direction from the surface 20A of the gate electrode 20 in gas plasma P containing nitric monoxide or oxygen and oxidizing the same.

For surface treatment for forming the interface layer 21, heat treatment may be used in addition to the foregoing plasma treatment. In the case of using the heat treatment, the part in the thickness direction from the surface 20A of the gate electrode 20 is oxidized by providing annealing treatment in the atmosphere containing oxygen or moisture, and thereby the interface layer 21 composed of a metal oxide is formed.

After that, the gate insulating film 30 is formed on the substrate 11 and the whole area of the interface layer 21 of the gate electrode 20. At this time, a film that is contacted with the interface 30B with the gate electrode 20 and is made of a low reducing material is preferably formed. If a high reducing film such as a silicon nitride film is formed directly on the interface layer 21 by CVD method, the interface layer 21 is reduced and work function is lowered.

As the film made of a low reducing material, for example, at least one of a silicon oxide film formed by CVD method, a silicon oxide film formed by sputtering method, a silicon nitride film formed by sputtering method, an aluminum oxide film formed by sputtering method, and an aluminum nitride film formed by sputtering method is preferably used. Such a film is able to be formed in a low reducing state.

Examples of a method of forming such a gate insulating film 30 include a case of forming a laminated film composed of a silicon nitride film or a silicon oxide film by plasma CVD (Chemical Vapor Deposition) method and a case of forming a silicon nitride film, a silicon oxide film, an aluminum oxide film, or an aluminum nitride film by sputtering method or the like.

Figure 2C:
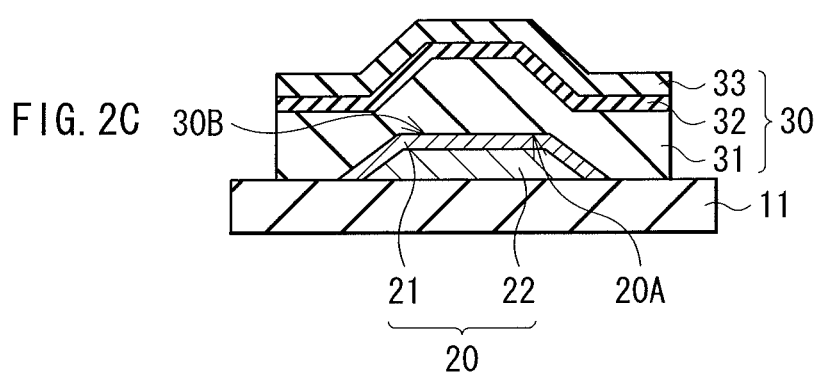

Specifically, as illustrated in FIG. 2C, for example, by plasma CVD method, the silicon oxide film 31, the silicon nitride film 32, and the silicon oxide film 33 are layered in this order from the gate electrode 20 side to form the gate insulating film 30. The silicon nitride film 32 is formed by plasma CVD method with the use of gas such as silane, ammonia, and nitrogen as raw material gas. The silicon oxide films 31 and 33 are formed by plasma CVD method with the use of gas containing silane and nitric monoxide as raw material gas.

Further, in the case of using sputtering method, for example, a silicon nitride film and a silicon oxide film are layered in this order from the gate electrode 20 side, and thereby the gate insulating film 30 is formed. As a sputtering target, silicon is used. Reactive plasma sputtering is performed by using oxygen, moisture, nitrogen or the like in the discharge atmosphere of sputtering, and thereby the silicon nitride film or the silicon oxide film is formed.

In this case, it is preferable that the step of providing the surface of the gate electrode 20 with plasma treatment and the step of forming the gate insulating film 30 are continuously performed in vacuum for the following reason. If the resultant after surface treatment is exposed in the air, carbon contamination in the air is adhered to the surface and thereby effect of surface treatment may be reduced.

Figure 3A:
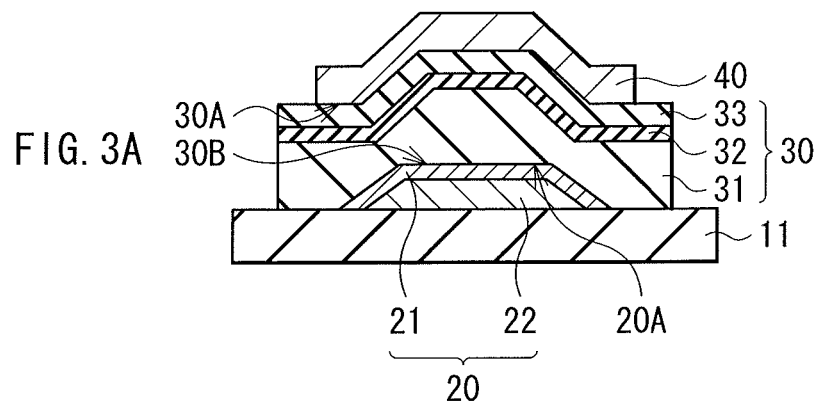
FIGS. 3A to 3C are cross sectional views illustrating steps following FIGS. 2A to 2C.

After the gate insulating film 30 is formed, as illustrated in FIG. 3A, the oxide semiconductor film 40 is formed on the gate insulating film 30 by, for example, sputtering method, and patterning is made in a desired shape.

In the case where the oxide semiconductor film 40 is composed of IGZO (indium gallium zinc oxide), the oxide semiconductor film 40 is formed on the gate insulating film 30 by plasma discharge with the use of mixed gas of argon and oxygen by using DC sputtering method with the use of indium gallium zinc oxide ceramic as a target. Before plasma discharge, the mixed gas of argon and oxygen is introduced after evacuation is made until the vacuum degree in a vacuum container becomes $1*10^{-4}$ Pa or less.

In the case where the oxide semiconductor film 40 is composed of zinc oxide, the oxide semiconductor film 40 is able to be formed by RF sputtering method with the use of zinc oxide ceramic as a target, or sputtering method with the use of a DC power source in gas atmosphere containing argon and oxygen by using a zinc metal target.

At this time, the carrier concentration in the oxide semiconductor film 40 to become a channel is controllable by changing flow ratio between argon and oxygen in forming an oxide.

Figure 3B:
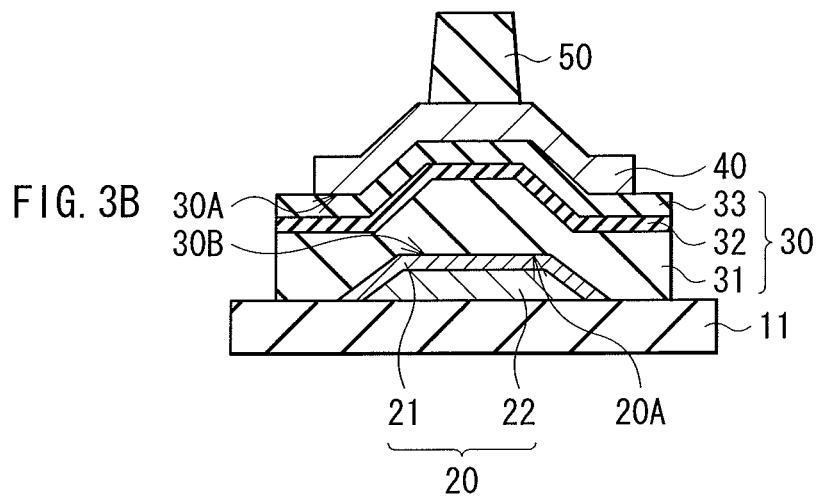

After the oxide semiconductor film 40 is formed, a silicon oxide film or a silicon nitride film is formed on the oxide semiconductor film 40 by, for example, CVD method or sputtering method, and patterning is made. Thereby, as illustrated in FIG. 3B, the channel protective film 50 that has the foregoing thickness and is made of the foregoing material is formed.

Figure 3C:
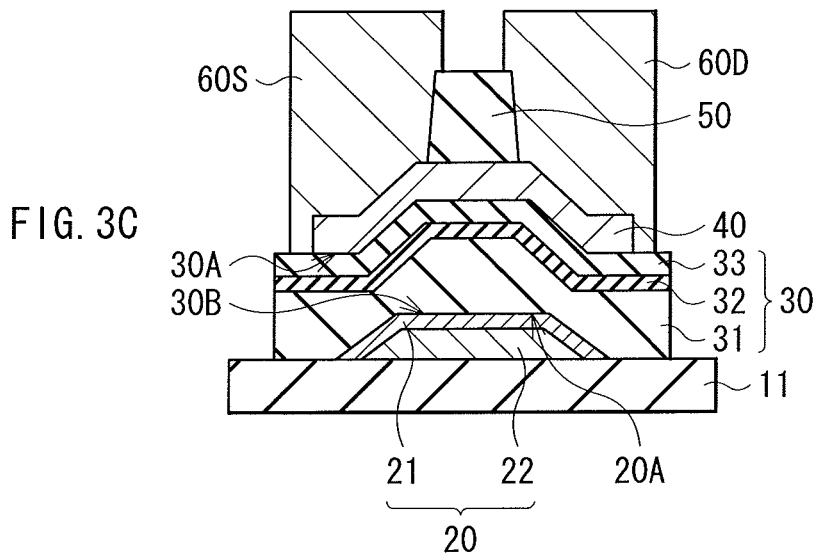

After the channel protective film 50 is formed, a molybdenum layer having a thickness of 50 nm, an aluminum layer having a thickness of 500 nm, and a molybdenum layer having a thickness of 50 nm are sequentially formed by, for example, sputtering method to form a three-layer laminated structure. Subsequently, the laminated structure is patterned by wet etching method using mixed liquid containing phosphoric acid, nitric acid, and acetic acid. Thereby, as illustrated in FIG. 3C, the source electrode 60S and the drain electrode 60D are formed. Accordingly, the thin film transistor 1 illustrated in FIG. 1 is completed.

In the thin film transistor 1, when a voltage (gate voltage) of a given threshold voltage or more is applied to the gate electrode 20 through a wiring layer (not illustrated), a current (drain current) is generated in the channel region of the oxide semiconductor film 40 between the source electrode region 60S and the drain electrode region 60D.

In this case, part in the thickness direction from the interface 20A with the gate insulating film 30 of the gate electrode 20 is the interface layer 21 composed of a metal oxide. Thus, work function in the interface 20A with the gate insulating film 30 of the gate electrode 20 is increased. Thus, in the following mathematical formula, work function difference ΦMS between the gate electrode 20 and the oxide semiconductor film 40 is increased, and threshold voltage Vth is increased (shifted in the positive direction).

$$V_{Th} = \phi_{MS} - \frac{Q_f}{C_{OX}} + 2\phi_f + \frac{\sqrt{2\varepsilon_s\varepsilon_0 qN_A 2\phi_f}}{C_{OX}}$$ Mathematical formula In the formula, Vth represents the threshold voltage, ΦMS represents the work function difference between a gate electrode and an oxide semiconductor film, Qf represents fixed charge, COX represents gate insulating film capacity, Φf represents Fermi level of the oxide semiconductor film as a channel, NA represents acceptor density, ∈S represents relative permittivity of the oxide semiconductor film, and Φ0 represents dielectric constant in vacuum, respectively.

Figure 4:
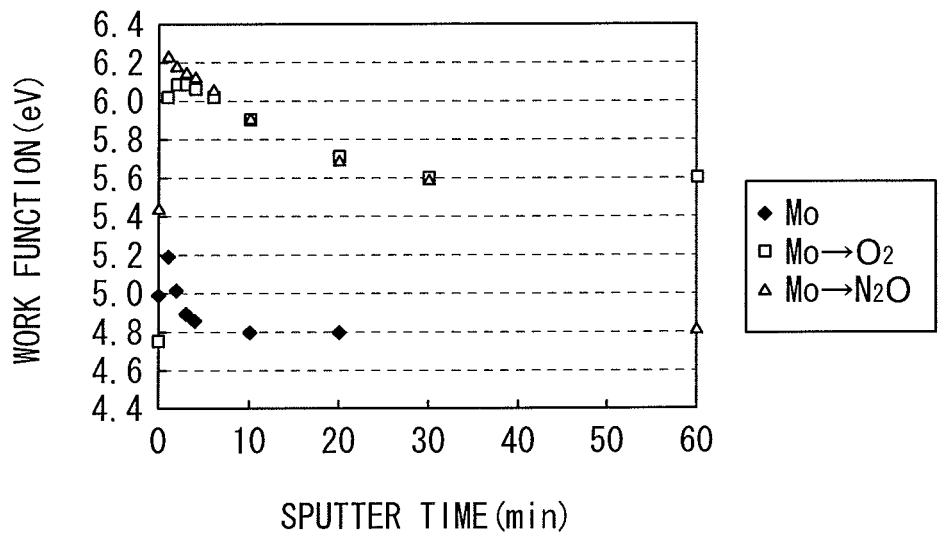
FIG. 4 illustrates a work function profile in the depth direction in the case where a gate electrode composed of molybdenum is oxidized by plasma treatment.
Figure 5:
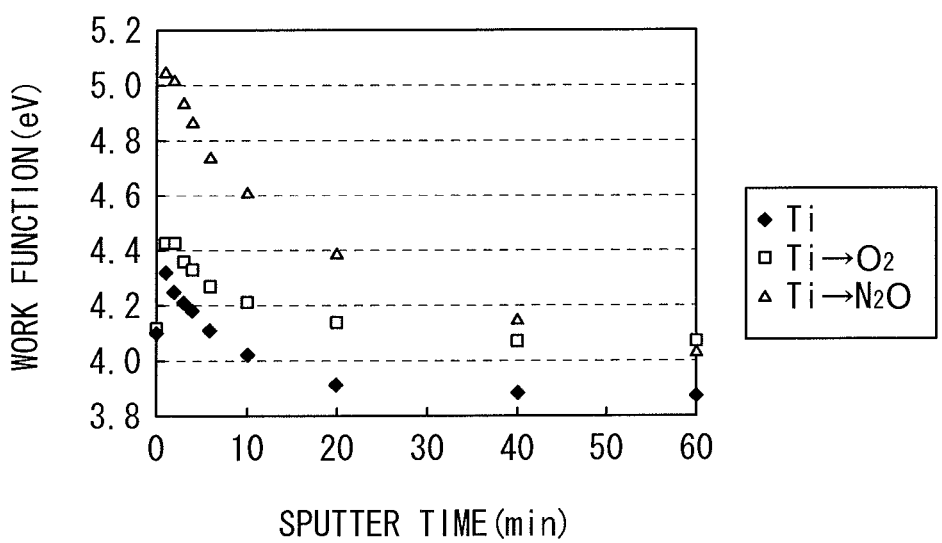
FIG. 5 illustrates a work function profile in the depth direction in the case where a gate electrode composed of titanium is oxidized by plasma treatment.

FIG. 4 and FIG. 5 respectively illustrate a result of work function analysis in the depth direction after oxidizing the surface of a metal film composed of molybdenum and the surface of a metal film composed of titanium by plasma treatment. From FIG. 4 and FIG. 5, it is found that work function is increased in the vicinity of the surface of the metal film. Plasma treatment is made by using O2 gas atmosphere or N2O gas atmosphere. It is found that as temperature and treatment time are increased, oxidation degree is increased and work function is increased.

Figure 6:
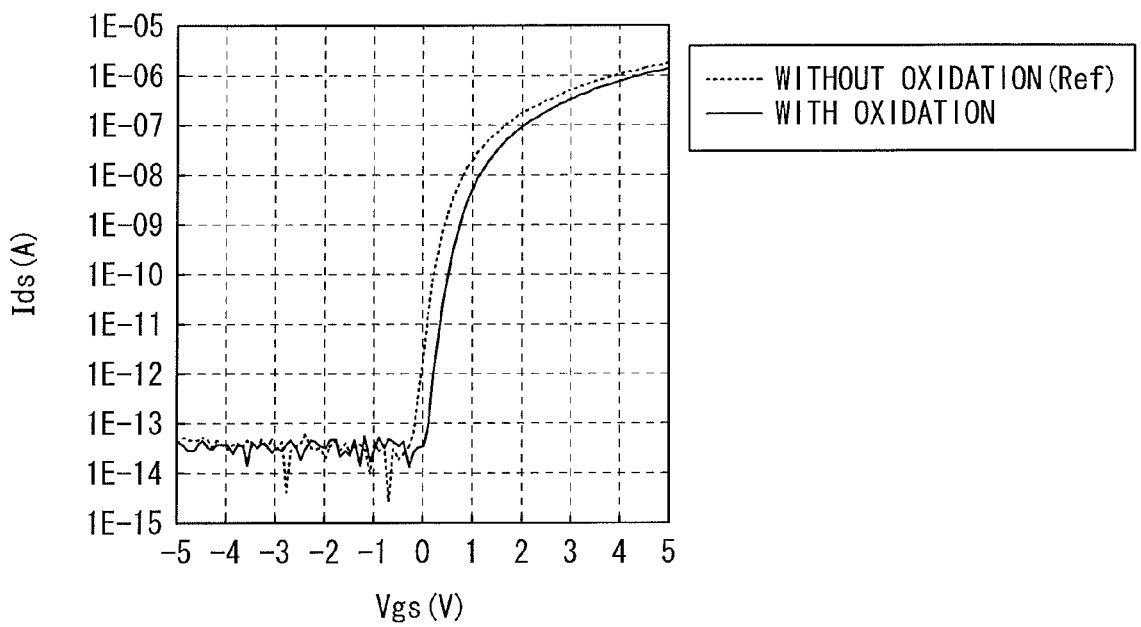
FIG. 6 illustrates a work function profile in the depth direction in the case where a silicon oxide film or a silicon nitride film is layered on the surface of the gate electrode composed of molybdenum.

FIG. 6 respectively illustrate TFT transfer characteristics for a case that the surface of the gate electrode is provided with oxidation treatment and for a case that the surface of the gate electrode is not provided with oxidation treatment by using molybdenum as the gate electrode. As evidenced by FIG. 7, the TFT in which the surface of the gate electrode is provided with oxidation treatment, transfer characteristics may be shifted in the positive direction by about 0.5 V compared to the TFT in which the surface of the gate electrode is not provided with oxidation treatment.

Further, the gate insulating film 30 contains a film that is contacted with the interface 30B with the gate electrode 20 and is made of a low reducing material such as a silicon oxide film. Thus, lowering of work function due to reduction of the interface layer 21 of the gate electrode 20 is inhibited. Accordingly, the threshold voltage Vth is prevented from being decreased (shifted in the negative direction).

Figure 7:
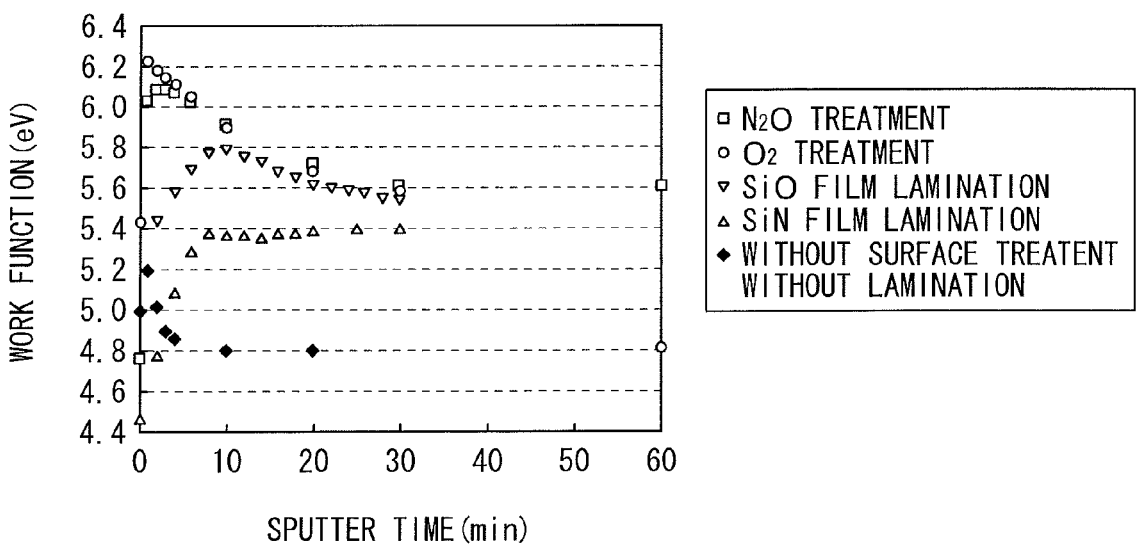
FIG. 7 illustrates transfer characteristics of a TFT in which the gate electrode composed of molybdenum is used.

FIG. 7 illustrates depth direction profile of work function for a case that a silicon oxide film is formed on the surface of a metal film composed of molybdenum, a case that a silicon nitride film is formed on the surface of a metal film composed of molybdenum, and a case that no film is formed on the surface of a metal film composed of molybdenum. From FIG. 7, it is found that work function is increased sequentially in the order of the case with the silicon nitride film, the case with the silicon oxide film, and the case with no film on the metal surface, and it is found that lowering of work function is able to be decreased by forming a low reducing film.

As described above, in the thin film transistor 1 of this embodiment, part in the thickness direction from the interface 20A with the gate insulating film 30 of the gate electrode 20 is the interface layer 21 composed of a metal oxide. Thus, the threshold voltage is able to be increased without adding impurity to the channel. Accordingly, it is possible to prevent a circuit configuration from being complicated in the case where a peripheral circuit of a liquid crystal display, an organic EL display unit or the like is configured by using the thin film transistor 1.

In the method of manufacturing the thin film transistor 1 of this embodiment, after the gate electrode 20 is formed on the substrate 11, part in the thickness direction from the surface of the gate electrode 20 is oxidized by using heat treatment or plasma treatment, and thereby the interface layer 21 composed of a metal oxide is formed. Thus, adding impurity to the channel is not necessitated, and the thin film transistor 1 of this embodiment is able to be manufactured by the simple steps.

Second Embodiment

FIG. 8A to FIG. 9C illustrate a method of manufacturing the thin film transistor 1 according to a second embodiment of the invention in order of steps. The manufacturing method is different from the manufacturing method of the foregoing first embodiment in that the interference layer 21 is formed by deposition by adding oxidation gas in forming the gate electrode 20. Thus, for the same steps, a description will be given with reference to FIGS. 2A to 3C.

Figure 8A:
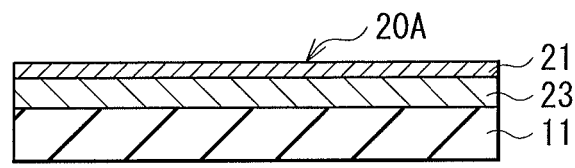
FIGS. 8A to 8C are cross sectional views illustrating a method of manufacturing a thin film transistor according to a second embodiment.

First, as illustrated in FIG. 8A, a metal film 23 to become a material of the gate electrode 20 is formed on the whole area of the substrate 11 by, for example, sputtering method. At this time, the interface layer 21 composed of a metal oxide is formed by forming part in the thickness direction from the interface 20A of the gate electrode 20 by adding oxidation gas.

Figure 8B:
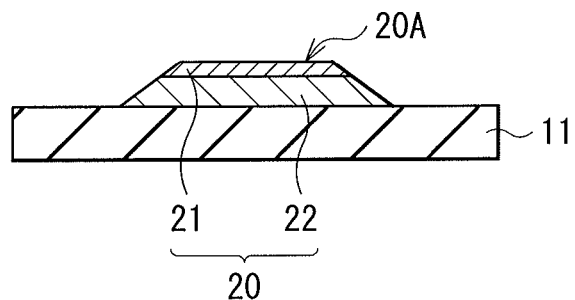

Next, as illustrated in FIG. 8B, the metal film 23 and the interface layer 21 are patterned by using, for example, photolithography method to form the gate electrode 20.

Figure 8C:
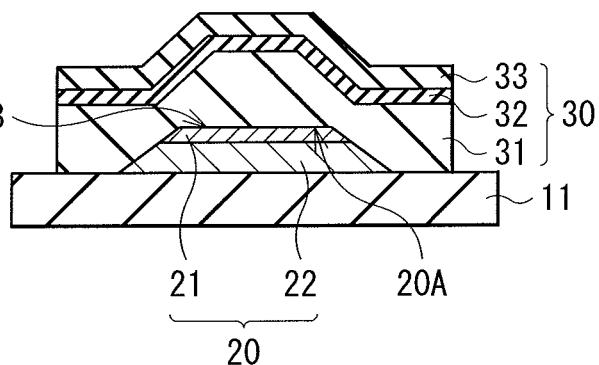

Subsequently, the gate insulating film 30 is formed on the substrate 11 and the whole area of the interface layer 21 of the gate electrode 20. At this time, a film that is contacted with the interface 30B with the gate electrode 20 and is made of a low reducing material is preferably formed as in the first embodiment. Specifically, as illustrated in FIG. 8C, for example, by plasma CVD method, the silicon oxide film 31 as the film made of a low reducing material, the silicon nitride film 32, and the silicon oxide film 33 are layered in this order from the gate electrode 20 side to form the gate insulating film 30.

Figure 9A:
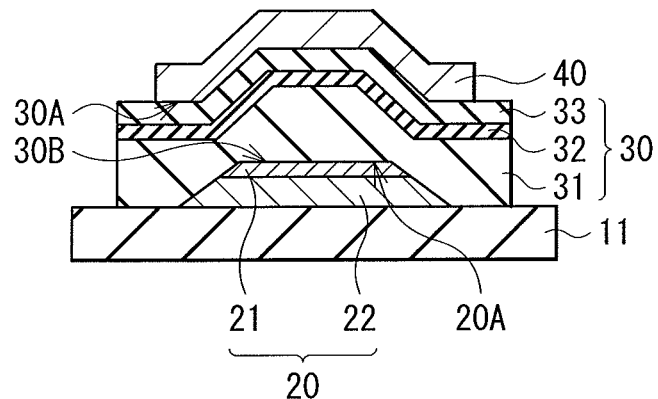
FIGS. 9A to 9C are cross sectional views illustrating steps following FIGS. 8A to 8C.

After the gate insulating film 30 is formed, as in the first embodiment, as illustrated in FIG. 9A, the oxide semiconductor film 40 is formed on the gate insulating film 30 by, for example, sputtering method, and patterning is made in a desired shape.

Figure 9B:
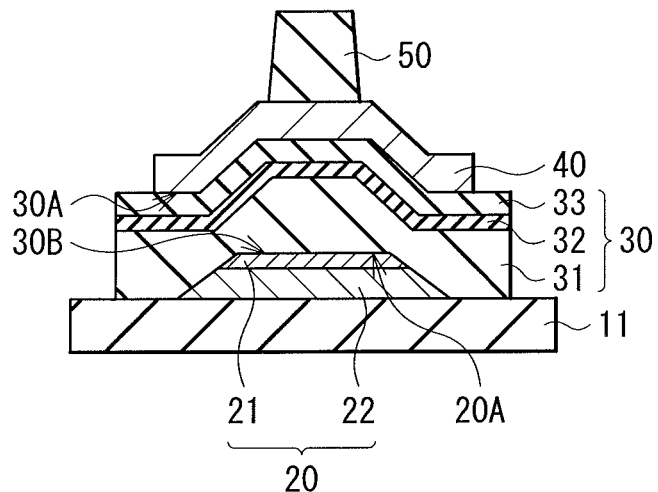

After the oxide semiconductor film 40 is formed, as in the first embodiment, as illustrated in FIG. 9B, the channel protective film 50 that has the foregoing thickness and is made of the foregoing material is formed on the oxide semiconductor film 40.

Figure 9C:
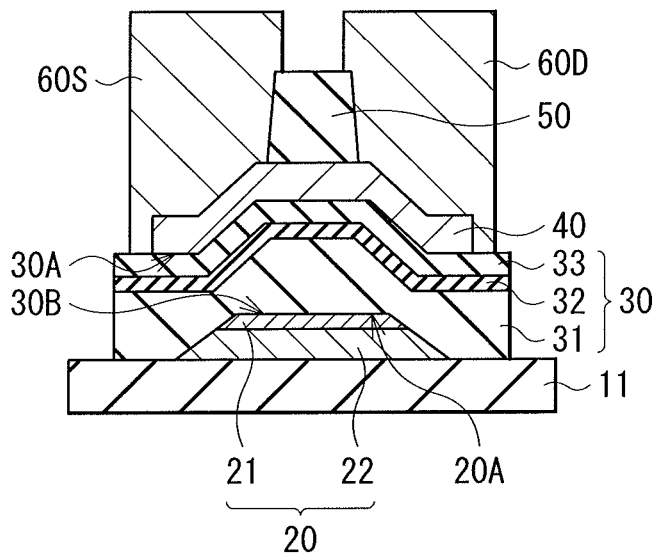

After the channel protective film 50 is formed, as in the first embodiment, as illustrated in FIG. 9C, the source electrode 60S and the drain electrode 60D that have the foregoing thickness and are made of the foregoing material are formed. Accordingly, the thin film transistor 1 illustrated in FIG. 1 is completed.

In the method of manufacturing the thin film transistor 1 of this embodiment, the gate electrode 20 is formed on the substrate 11, part in the thickness direction from the surface 20A of the gate electrode 20 is formed by adding the oxidation gas, and thereby the interface layer 21 composed of the metal oxide is formed. Thus, adding impurity to the channel is not necessitated, and the thin film transistor 1 may be manufactured by simple steps as in the first embodiment.

Third Embodiment

Figure 10:
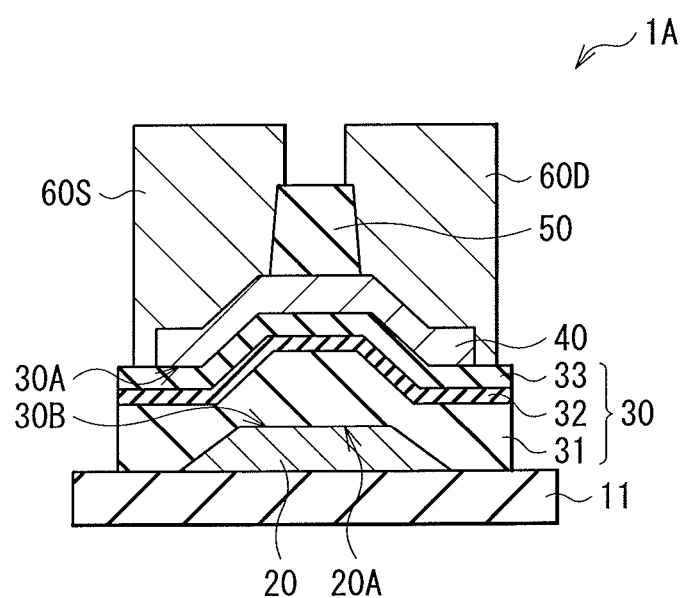
FIG. 10 is a cross sectional view illustrating a structure of a thin film transistor according to a third embodiment.

FIG. 10 illustrates a cross sectional structure of a thin film transistor 1A according to a third embodiment of the invention. The thin film transistor 1A has a structure similar to that of the foregoing first embodiment, except that all in the thickness direction from the interface 20A with the gate insulating film 30 of the gate electrode 20 is made of a metal oxide film. Thus, a description will be given by affixing the same referential symbol for a corresponding element.

Figure 11A:
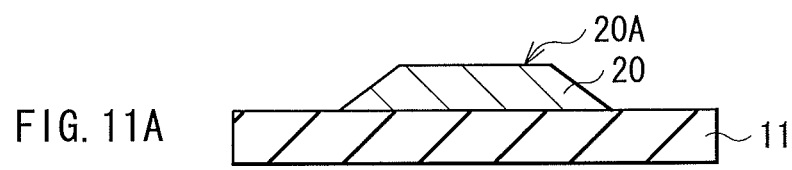
FIGS. 11A to 11C are cross sectional views illustrating a method of manufacturing the thin film transistor illustrated in FIG. 10 in order of steps.

FIG. 11A to FIG. 12B illustrate a method of manufacturing the thin film transistor 1A in order of steps. First, as illustrated in FIG. 11A, in forming the gate electrode 20 on the substrate 11, all in the thickness direction from the surface 20A of the gate electrode 20 is composed of a metal oxide.

As a method of forming the gate electrode 20, as in the first embodiment, after the gate electrode 20 is formed on the substrate 11, all in the thickness direction from the surface 20A of the gate electrode 20 may be oxidized by using heat treatment or plasma treatment.

Otherwise, as in the second embodiment, all in the thickness direction from the surface 20A of the gate electrode 20 may be formed by adding oxygen gas in forming a metal film to become a material of the gate electrode 20 on the whole area of the substrate 11 by, for example, sputtering method.

Figure 11B:
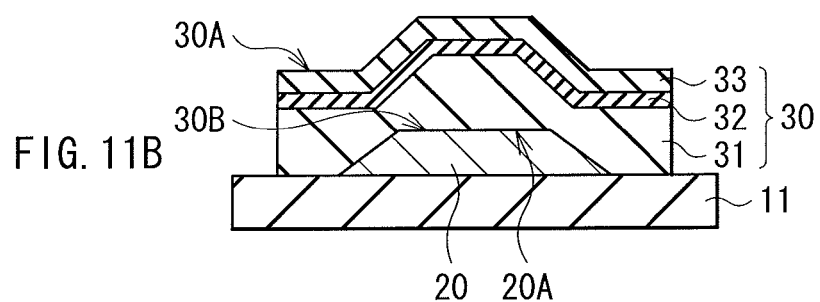

Next, the gate insulating film 30 is formed on the substrate 11 and the whole area of the interface layer 21 of the gate electrode 20. At this time, a film that is contacted with the interface 30B with the gate electrode 20 and is made of a low reducing material is preferably formed as in the first embodiment. Specifically, as illustrated in FIG. 11B, for example, by plasma CVD method, the silicon oxide film 31 as the film made of a low reducing material, the silicon nitride film 32, and the silicon oxide film 33 are layered in this order from the gate electrode 20 side to form the gate insulating film 30.

Figure 11C:
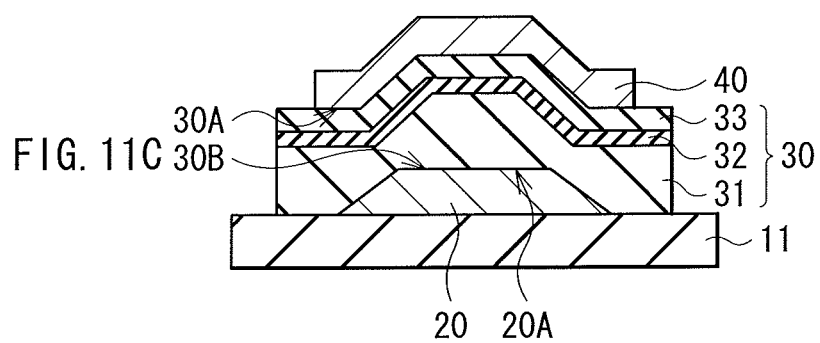

After the gate insulating film 30 is formed, as in the first embodiment, as illustrated in FIG. 11C, the oxide semiconductor film 40 is formed on the gate insulating film 30 by, for example, sputtering method, and patterning is made in a desired shape.

Figure 12A:
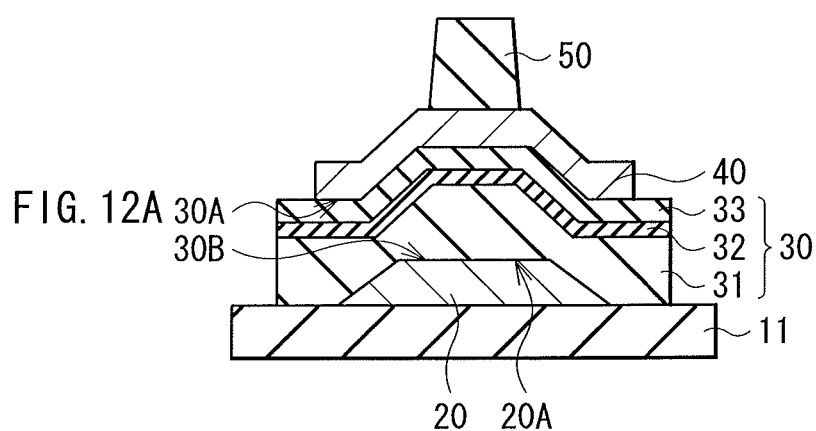
FIGS. 12A and 12B are cross sectional views illustrating steps following FIGS. 11A to 11C.

After the oxide semiconductor film 40 is formed, as in the first embodiment, as illustrated in FIG. 12A, the channel protective film 50 that has the foregoing thickness and is made of the foregoing material is formed on the oxide semiconductor film 40.

Figure 12B:
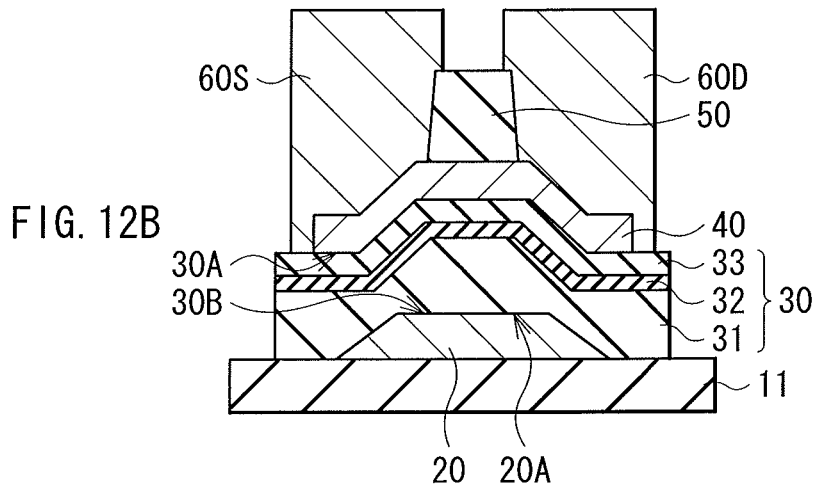

After the channel protective film 50 is formed, as in the first embodiment, as illustrated in FIG. 12B, the source electrode 60S and the drain electrode 60D that have the foregoing thickness and are made of the foregoing material are formed. Accordingly, the thin film transistor 1A illustrated in FIG. 10 is completed.

Operation and effect of the thin film transistor 1A are similar to those of the first embodiment and the second embodiment.

Fourth Embodiment

Figure 13:
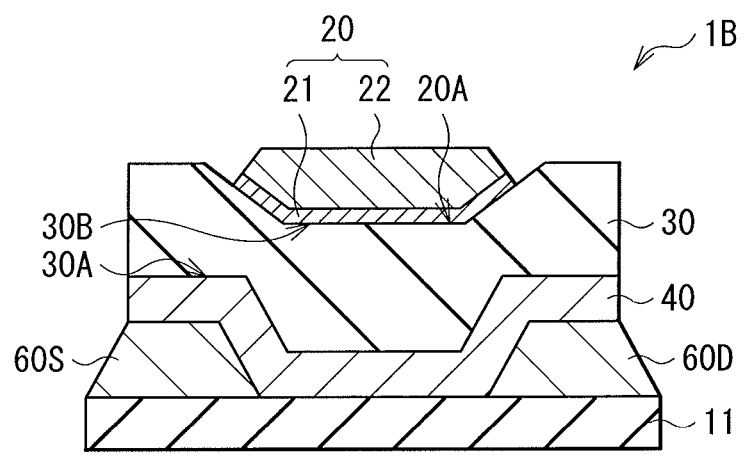
FIG. 13 is a cross sectional view illustrating a structure of a thin film transistor according to a fourth embodiment.

FIG. 13 illustrates a cross sectional structure of a thin film transistor 1B according to a fourth embodiment of the invention. The thin film transistor 1B has a structure similar to that of the foregoing first embodiment, except that the thin film transistor 1B is a top gate type TFT (staggered structure) in which the source electrode 60S and the drain electrode 60D, the oxide semiconductor film 40, the gate insulating film 30, and the gate electrode 20 are layered in this order on the substrate 11. Thus, a description will be given by affixing the same referential symbol for a corresponding element.

Figure 14A:
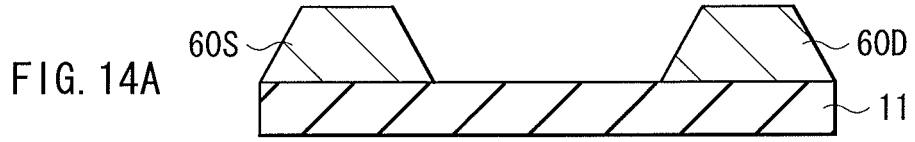
FIGS. 14A to 14C are cross sectional views illustrating a method of manufacturing the thin film transistor illustrated in FIG. 13 in order of steps.

FIG. 14A to FIG. 15B illustrate a method of manufacturing the thin film transistor 1B in order of steps. First, as illustrated in FIG. 14A, the source electrode 60S and the drain electrode 60D that have the foregoing thickness and are made of the foregoing material are formed on the substrate 11 as in the first embodiment.

Figure 14B:
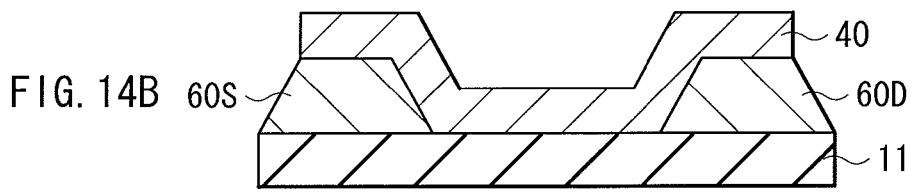

Next, as illustrated in FIG. 14B, as in the first embodiment, the oxide semiconductor film 40 is formed by, for example, sputtering method, and patterning is made in a desired shape.

Figure 14C:
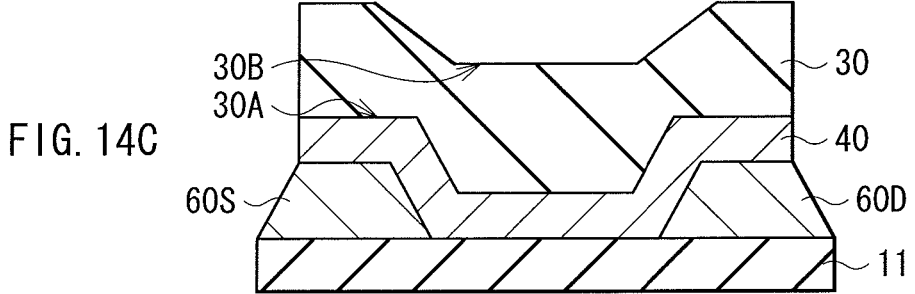

Subsequently, as illustrated in FIG. 14C, the gate insulating film 30 is formed on the substrate 11 and the whole area of the oxide semiconductor film 40. As the gate insulating film 30, for example, a laminated film composed of a silicon nitride film or a silicon oxide film may be formed by plasma CVD method, or a silicon nitride film, a silicon oxide film, an aluminum oxide film, or an aluminum nitride film may be formed by sputtering method or the like.

Figure 15A:
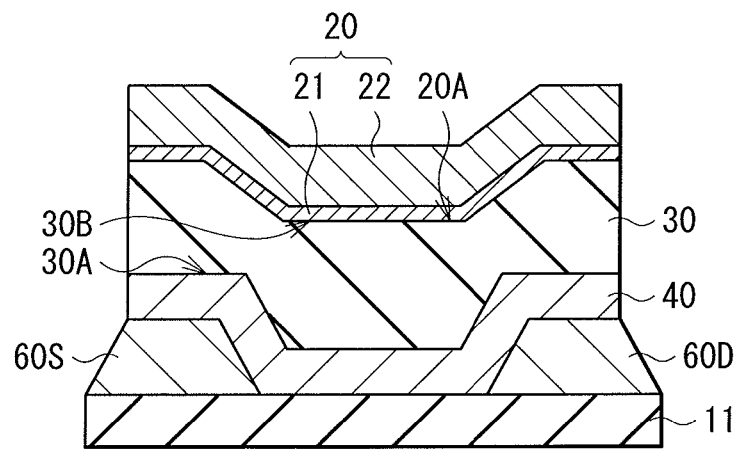
FIGS. 15A and 15B are cross sectional views illustrating steps following FIGS. 14A to 14C.

After that, the gate electrode 20 is formed on the gate insulating film 30 by, for example, sputtering method. At this time, first as illustrated in FIG. 15A, part in the thickness direction from the interface 20A with the gate insulating film 30 of the gate electrode 20 is formed by adding the oxygen gas, and thereby the interface layer 21 composed of the metal oxide is formed.

Subsequently, as illustrated in FIG. 15A again, adding the oxygen gas is stopped, and a remaining section in the thickness direction of the gate electrode 20 is formed. Thereby, the remaining section in the thickness direction of the gate electrode 20 becomes the metal layer 22.

Figure 15B:
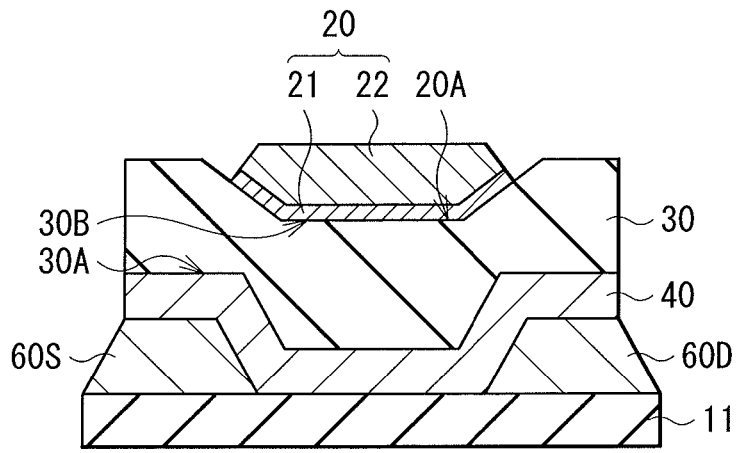

After that, as illustrated in FIG. 15B, the metal layer 22 and the interface layer 21 are patterned by using, for example, photolithography, and thereby the gate electrode 20 is formed. In this embodiment, the surface of the interface layer 21 is coated with the metal layer 22. Thus, it is not necessary to consider reducing effect by the gate insulating film 30 after forming the gate electrode 20. However, it is difficult to form the interface layer 21 by surface treatment such as heat treatment and plasma treatment. Thus, adding oxygen gas at the time of film forming is necessitated. Accordingly, the thin film transistor 1B illustrated in FIG. 13 is completed.

Operation and effect of the thin film transistor 1B are similar to those of the first embodiment and the second embodiment.

According to the method of manufacturing the thin film transistor 1B of this embodiment, after the source electrode 60S and the drain electrode 60D, the oxide semiconductor film 40, and the gate insulating film 30 are sequentially formed on the substrate 11, the gate electrode 20 is formed on the gate insulating film 30, part in the thickness direction from the interface 20A with the gate insulating film 30 of the gate electrode 20 is formed by adding the oxidation gas, and thereby the interface layer 21 composed of the metal oxide is formed. Thus, adding impurity to the channel is not necessitated, and the thin film transistor 1B may be manufactured by the simple steps.

Fifth Embodiment

Figure 16:
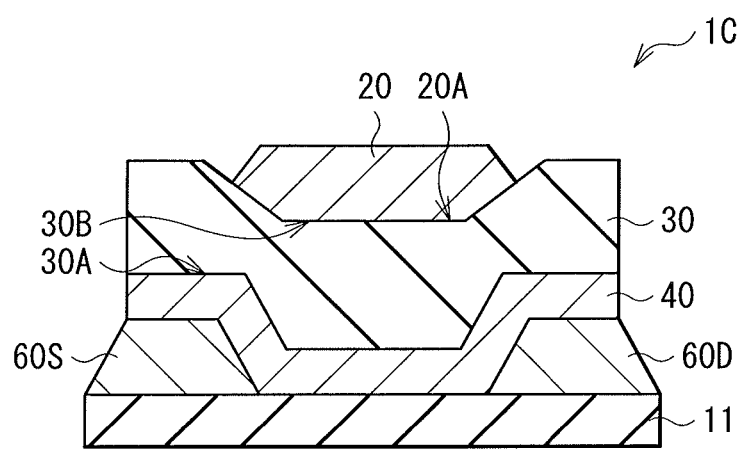
FIG. 16 is a cross sectional view illustrating a structure of a thin film transistor according to a fifth embodiment.

FIG. 16 illustrates a cross sectional structure of a thin film transistor 1C according to a fifth embodiment of the invention. The thin film transistor 1C has a structure similar to that of the foregoing fourth embodiment, except that all in the thickness direction from the interface 20A with the gate insulating film 30 of the gate electrode 20 is made of a metal oxide film. Thus, a description will be given by affixing the same referential symbol for a corresponding element.

Figure 17A:
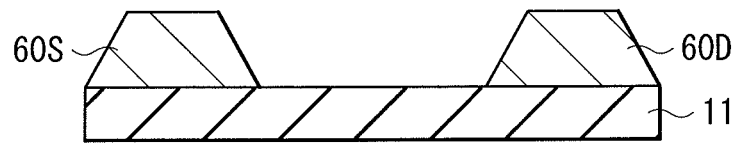
FIGS. 17A to 17D are cross sectional views illustrating a method of manufacturing the thin film transistor illustrated in FIG. 16 in order of steps.

FIG. 17A to FIG. 17D illustrate a method of manufacturing the thin film transistor 1C in order of steps. First, as illustrated in FIG. 17A, the source electrode 60S and the drain electrode 60D that have the foregoing thickness and are made of the foregoing material are formed on the substrate 11 as in the first embodiment.

Figure 17B:
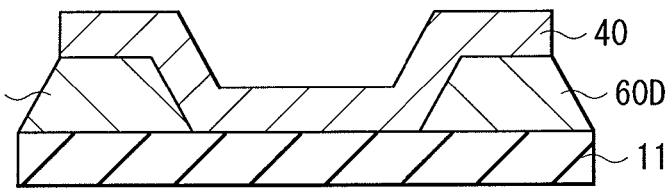

Next, as illustrated in FIG. 17B, as in the first embodiment, the oxide semiconductor film 40 is formed by, for example, sputtering method, and patterning is made in a desired shape.

Figure 17C:
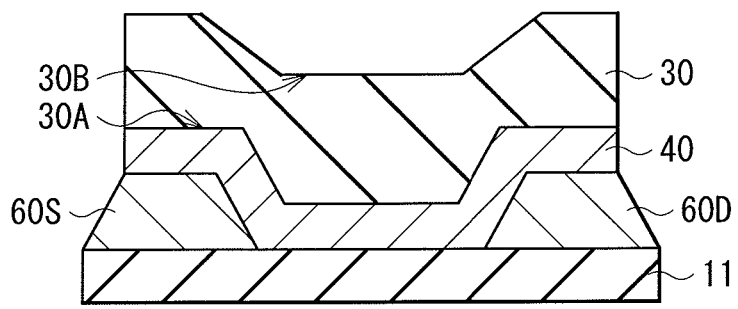

Subsequently, as illustrated in FIG. 17C, the gate insulating film 30 is formed on the substrate 11 and the whole area of the oxide semiconductor film 40. As the gate insulating film 30, for example, a laminated film composed of a silicon nitride film or a silicon oxide film may be formed by plasma CVD method, or a silicon nitride film, a silicon oxide film, an aluminum oxide film, or an aluminum nitride film may be formed by sputtering method or the like.

Figure 17D:
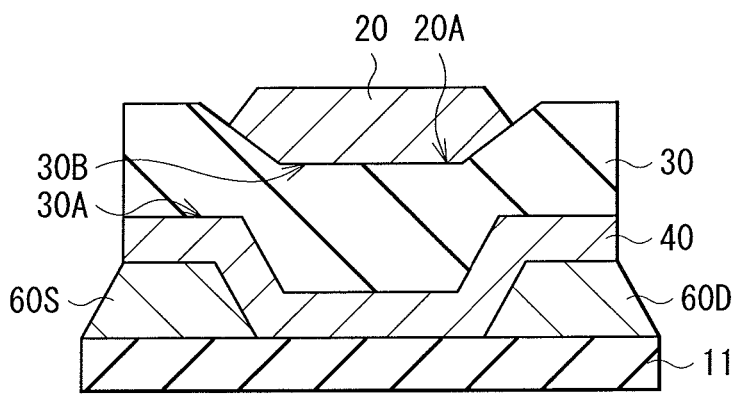

After that, as illustrated in FIG. 17D, the gate electrode 20 is formed on the gate insulating film 30 by, for example, sputtering method, and patterning is made by, for example, photolithography. At this time, all in the thickness direction from the interface 20A with the gate insulating film 30 of the gate electrode 20 is formed by adding the oxidation gas, and thereby the entire gate electrode 20 is composed of the metal oxide. Accordingly, the thin film transistor 1C illustrated in FIG. 16 is completed.

Operation and effect of the thin film transistor 1C are similar to those of the first embodiment and the second embodiment.

First Application Example

Figure 18:
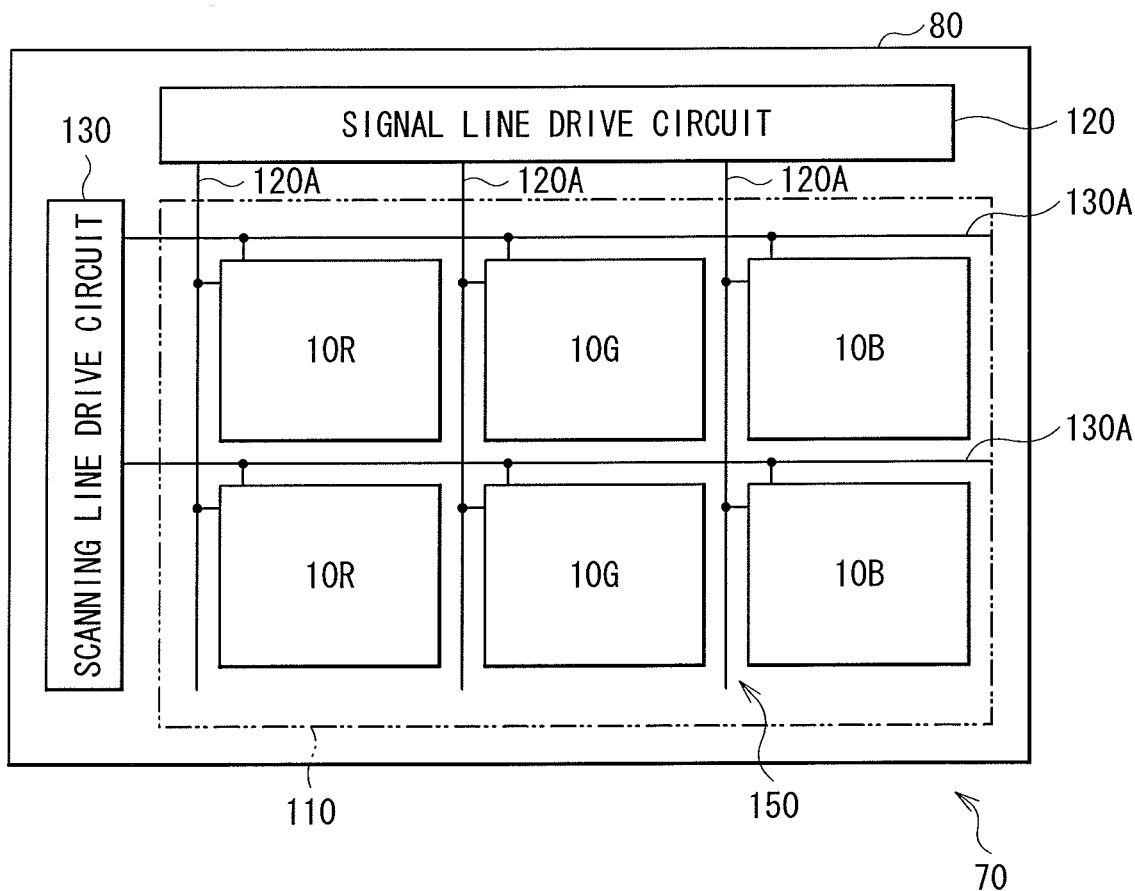
FIG. 18 is a diagram illustrating a circuit configuration of a display unit according to a first application example.

FIG. 18 illustrates a circuit configuration of a display unit including the thin film transistor 1 as a drive element. A display unit 70 is, for example, a liquid crystal display, an organic EL display or the like. In the display unit 70, a plurality of pixels 10R, 10G, and 10B arranged in a state of matrix and various drive circuits for driving the pixels 10R, 10G, and 10B are formed on a drive panel 80. The pixels 10R, 10G, and 10B are respectively a liquid crystal display device, an organic EL device or the like that emit color light of red (R: red), green (G: green), and blue (B: blue). One pixel combination is composed of the three pixels 10R, 10G, and 10B, and a plurality of pixel combinations configure a display region 110. On the drive panel 80, as a drive circuit, a signal line drive circuit 120 and a scanning line drive circuit 130 as a driver for displaying a video and a pixel drive circuit 150 are arranged. A sealing panel (not illustrated) is bonded to the drive panel 80. The pixels 10R, 10G, and 10B and the foregoing drive circuits are sealed by the sealing panel.

Figure 19:
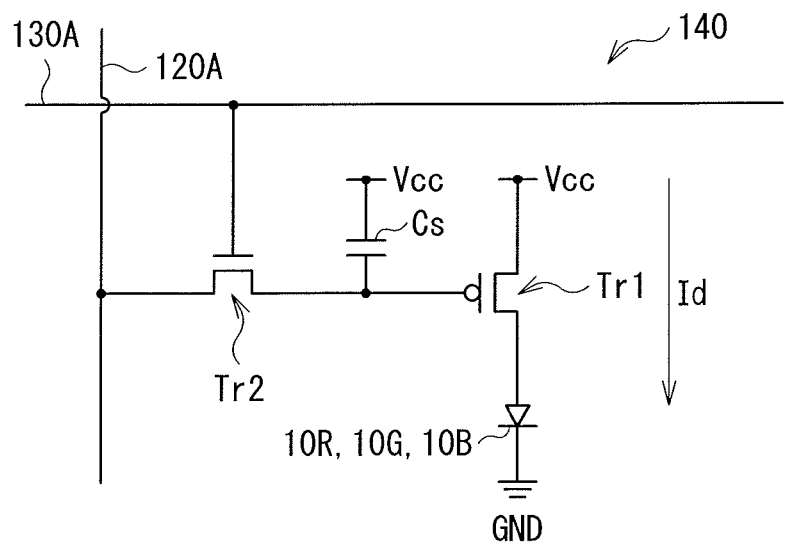
FIG. 19 is an equivalent circuit diagram illustrating an example of the pixel drive circuit illustrated in FIG. 18.

FIG. 19 is an equivalent circuit diagram of the pixel drive circuit 150. The pixel drive circuit 150 is an active drive circuit in which transistors Tr1 and Tr2 as the foregoing thin film transistors 1 and 1A to 1C are arranged. A capacitor Cs is provided between the transistors Tr1 and Tr2. The pixel 10R (or the pixel 10G/10B) is connected to the transistor Tr1 in series between a first power source line (Vcc) and a second power source line (GND). In such a pixel drive circuit 150, a plurality of signal lines 120A are arranged in the column direction, and a plurality of scanning lines 130A are arranged in the row direction. Each signal line 120A is connected to the signal line drive circuit 120. An image signal is supplied from the signal line drive circuit 120 to a source electrode of the transistor Tr2 through the signal line 120A. Each scanning line 130A is connected to the scanning line drive circuit 130. A scanning signal is sequentially supplied from the scanning line drive circuit 130 to a gate electrode of the transistor Tr2 through the scanning line 130A. Such a display unit 70 may be mounted on, for example, the electronic devices of second to sixth application examples described below.

Second Application Example

Figure 20:
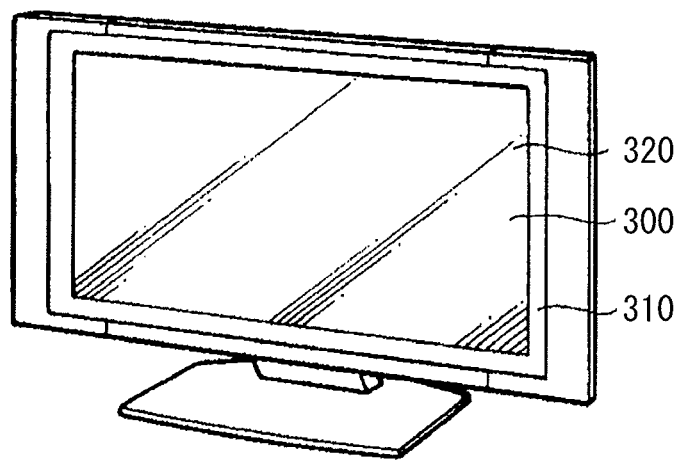
FIG. 20 is a perspective view illustrating an appearance of a second application example.

FIG. 20 illustrates an appearance of a television device. The television device has, for example, a video display screen section 300 including a front panel 310 and a filter glass 320.

Third Application Example

Figure 21A:
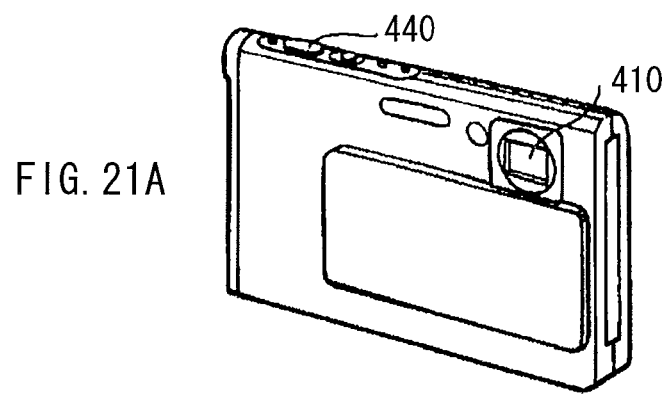
FIG. 21A is a perspective view illustrating an appearance viewed from the front side of a third application example.
Figure 21B:
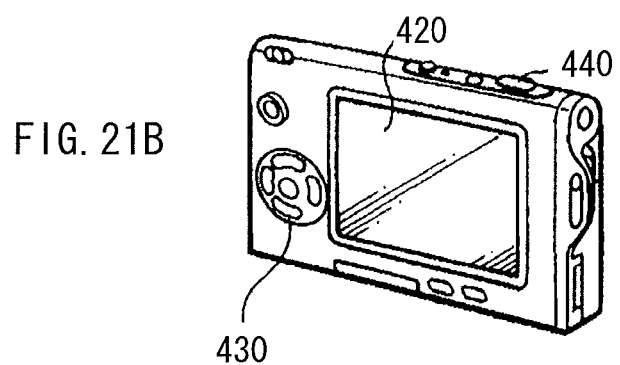
FIG. 21B is a perspective view illustrating an appearance viewed from the rear side of the third application example.

FIGS. 21A and 21B illustrate an appearance of a digital still camera. The digital still camera has, for example, a light emitting section for a flash 410, a display section 420, a menu switch 430, and a shutter button 440.

Fourth Application Example

Figure 22:
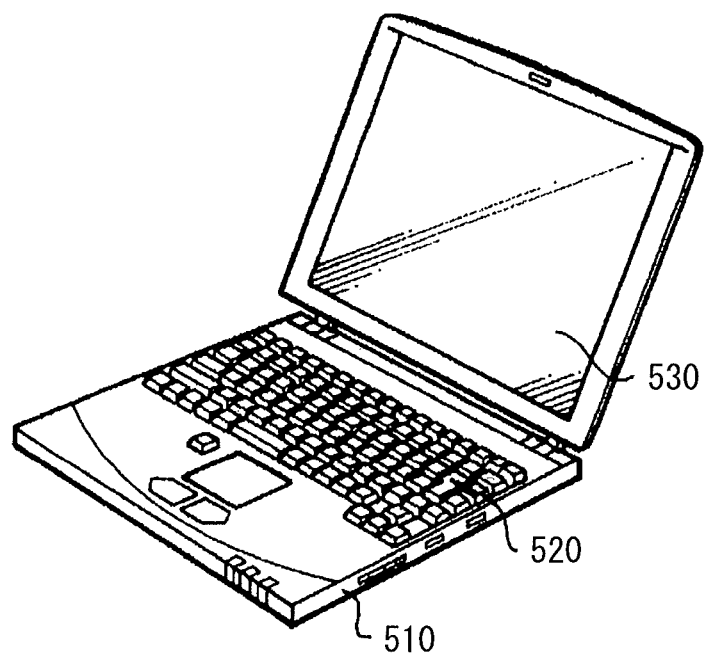
FIG. 22 is a perspective view illustrating an appearance of a fourth application example.

FIG. 22 illustrates an appearance of a notebook personal computer. The notebook personal computer has, for example, a main body 510, a keyboard 520 for operation of inputting characters and the like, and a display section 530 for displaying an image.

Fifth Application Example

Figure 23:
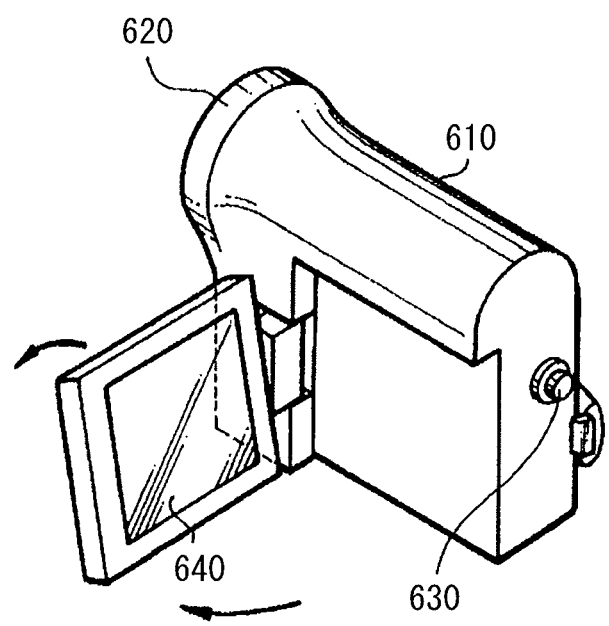
FIG. 23 is a perspective view illustrating an appearance of a fifth application example.

FIG. 23 illustrates an appearance of a video camera. The video camera has, for example, a main body 610, a lens for capturing an object 620 provided on the front side face of the main body 610, a start/stop switch in capturing 630, and a display section 640.

Sixth Application Example

FIGS. 24A to 24G illustrate an appearance of a mobile phone. In the mobile phone, for example, an upper package 710 and a lower package 720 are jointed by a joint section (hinge section) 730. The mobile phone has a display 740, a sub-display 750, a picture light 760, and a camera 770.

The application is claimed as follows:

1. A thin film transistor comprising:
a gate electrode formed on a substrate, the gate electrode including a metal layer formed on the substrate and an interface layer formed on the metal layer;
a gate insulating film formed on the substrate and on the interface layer; and
an oxide semiconductor film formed on the gate insulating film,
wherein the interface layer includes a metal oxide and is positioned between the gate insulating film and the metal layer.

2. The thin film transistor of claim 1, wherein the metal layer includes a metal substance or alloy thereof selected from the group consisting of platinum, titanium, ruthenium, molybdenum, copper, tungsten, and nickel.

3. The thin film transistor of claim 1, wherein the metal oxide contains at least one metal component selected from the group consisting of platinum, titanium, ruthenium, molybdenum, copper, tungsten, and nickel.

4. The thin film transistor of claim 1, wherein the gate insulating film includes a low reducing material.

5. The thin film transistor of claim 1, wherein the thin film transistor is configured as a top gate structure or a bottom gate structure.

6. The thin film transistor of claim 4, wherein the low reducing material is selected from the group consisting of a silicon oxide film, a silicon nitride film, an aluminum oxide film, an aluminum nitride film, and combinations thereof.

7. An electric device comprising:
a thin film transistor including
a gate electrode formed on a substrate, the gate electrode including a metal layer formed on the substrate and an interface layer formed on the metal layer,
a gate insulating film formed on the substrate and on the interface layer, and
an oxide semiconductor film formed on the gate insulating film,
wherein the interface layer includes a metal oxide and is positioned between the gate insulating film and the metal layer.

8. The electric device of claim 7, wherein the metal layer includes a metal substance or alloy thereof selected from the group consisting of platinum, titanium, ruthenium, molybdenum, copper, tungsten, and nickel.

9. The electric device of claim 7, wherein the metal oxide contains at least one metal component selected from the group consisting of platinum, titanium, ruthenium, molybdenum, copper, tungsten, and nickel.

10. The electric device of claim 7, wherein the gate insulating film includes a low reducing material.

11. The electric device of claim 7, wherein the thin film transistor is configured as a top gate structure or a bottom gate structure.

12. The electric device of claim 10, wherein the low reducing material is selected from the group consisting of a silicon oxide film, a silicon nitride film, an aluminum oxide film, an aluminum nitride film, and combinations thereof.

13. A display device comprising:
a thin film transistor including
a gate electrode fowled on a substrate, the gate electrode including a metal layer foil led on the substrate and an interface layer formed on the metal layer,
a gate insulating film formed on the substrate and on the interface layer, and
an oxide semiconductor film formed on the gate insulating film,
wherein the interface layer includes a metal oxide and is positioned between the gate insulating film and the metal layer.

14. The display device of claim 13, wherein the metal layer includes a metal substance or alloy thereof selected from the group consisting of platinum, titanium, ruthenium, molybdenum, copper, tungsten, and nickel.

15. The display device of claim 13, wherein the metal oxide contains at least one metal component selected from the group consisting of platinum, titanium, ruthenium, molybdenum, copper, tungsten, and nickel.

16. The display device of claim 13, wherein the gate insulating film includes a low reducing material.

17. The display device of claim 13, wherein the thin film transistor is configured as a top gate structure or a bottom gate structure.

18. The display device of claim 16, wherein the low reducing material is a silicon oxide film.

19. A method of forming a thin film transistor, the method comprising:
forming a gate electrode on a substrate, the gate electrode including a metal layer formed on the substrate and an interface layer formed on the metal layer;
forming a gate insulating film on the substrate and on the interface layer, and
forming an oxide semiconductor film on the gate insulating film,
wherein the interface layer includes a metal oxide and is positioned between the gate insulating film and the metal layer.

20. The method of claim 19, wherein the metal oxide is formed by applying a gas plasma to the metal layer.

21. The method of claim 19, wherein the metal oxide is formed by applying a heat treatment to the metal layer.

22. The method of claim 19, wherein the metal oxide is formed by applying an oxidation gas to the metal layer during formation of the gate electrode.

23. The method of claim 19, wherein the metal oxide contains at least one metal component selected from the group consisting of platinum, titanium, ruthenium, molybdenum, copper, tungsten, and nickel.

24. The method of claim 19, wherein the gate insulating film includes a low reducing material.

25. The method of claim 23, wherein the low reducing material is selected from the group consisting of a silicon oxide film, a silicon nitride film, an aluminum oxide film, an aluminum nitride film, and combinations thereof.

26. The method of claim 19, wherein the thin film transistor is configured as a top gate structure or a bottom gate structure.

27. The method of claim 19, further comprising producing an electric device including the thin film transistor.

28. The method of claim 19, further comprising producing a display device including the thin film transistor.

29. The method of claim 20, wherein the gas plasma contains nitric monoxide or oxygen.

30. The method of claim 21, wherein the heat treatment is annealing in an atmosphere containing oxygen or moisture.

31. The method of claim 22, wherein the metal layer includes a metal substance or alloy thereof selected from the group consisting of platinum, titanium, ruthenium, molybdenum, copper, tungsten, and nickel.

* * * * *